United States Patent
Trueggelmann

Patent Number: 6,065,681
Date of Patent: May 23, 2000

[54] METHOD OF PRODUCING DATA CARRIERS

[75] Inventor: Uwe Trueggelmann, Paderborn, Germany

[73] Assignee: Orga Kartensysteme GmbH, Paderborn, Germany

[21] Appl. No.: 09/015,522

[22] Filed: Jan. 29, 1998

[30] Foreign Application Priority Data

Jan. 29, 1997 [DE] Germany ............................ 197 03 122

[51] Int. Cl.$^7$ .................................................. G06K 19/00
[52] U.S. Cl. ............................................. 235/487; 235/492
[58] Field of Search ...................... 235/380, 375, 235/487, 492, 494; 425/542, 546, 572

[56] References Cited

U.S. PATENT DOCUMENTS

| 5,013,900 | 5/1991 | Hoppe ....................................... 235/492 |
| 5,681,356 | 10/1997 | Barak et al. ............................ 29/25.01 |

FOREIGN PATENT DOCUMENTS

| 0 328 124 | 8/1989 | European Pat. Off. . |
| 0 495 216 | 7/1992 | European Pat. Off. . |
| 0 521 778 | 1/1993 | European Pat. Off. . |
| 0 702 325 | 3/1996 | European Pat. Off. . |
| 0 742 533 | 11/1996 | European Pat. Off. . |
| 41 32 720 | 4/1993 | Germany . |
| 295 04 946 | 9/1995 | Germany . |
| 295 03 249 | 12/1995 | Germany . |
| 44 19 973 | 12/1995 | Germany . |
| 96 36009 | 11/1996 | WIPO . |
| 97 31334 | 8/1997 | WIPO . |

Primary Examiner—Karl D. Frech
Attorney, Agent, or Firm—Foley & Lardner

[57] ABSTRACT

A method of producing a data carrier having a carrier card, and a minichip card which can be removed from the carrier card and has an integrated circuit therein, comprising the steps of: forming one of the minichip card and the carrier card with a first material having a first softening temperature; forming the other of the minichip card and the carrier card with a second material having a second softening temperature different from the first softening temperature, in the presence of the card formed in the first step in such a way that the minichip card is held in a receiving window of the carrier card by the latter with a form fit, while avoiding material bonding with the carrier card.

25 Claims, 1 Drawing Sheet

METHOD OF PRODUCING DATA CARRIERS

BACKGROUND OF THE INVENTION

Data carriers comprising a carrier card and a minichip card, which is embedded in the latter and has an integrated circuit, are used, for example, as phone cards, health insurance cards, as identification and access authorization cards for mobile radio systems, such as for example GSM telephones, or as credit or cash cards. In GSM telephones, for example, two types of so-called GSM cards can be used. For a first mobile phone system, use is made of a card the size of a credit card (full-size card), the dimensions of which (85×54 mm) correspond to the dimensions of the carrier card. Customary for a second type of mobile phone system are smaller cards (plug-in modules) which, when comprised as minichip cards with the usual dimensions of 25×15 mm, can be inserted into the mobile phones. The integrated circuits (chips) securely mounted on both types of cards typically have the same dimensions and electronic functions. In order that both mobile phone systems can be used with the aid of a single card, it is known to connect the minichip card detachably to a recess in the carrier card provided for that purpose. For example, the minichip card may be held by means of a form fit in a pocket-like receptacle of a carrier card. See DE 44 19 973 A1. DE 295 04 946 U1 discloses a carrier card which has in the region of a recess provided for the minichip card a layer of adhesive tape, so that, on the one hand, the minichip card is adhesively bonded to the carrier card for use in one of the mobile phone systems. On the other hand, by removing the minichip card from the carrier card, the minichip card can be used in the other mobile phone system. To produce the above-mentioned data carriers, it is usual to produce the carrier card on the one hand in two separate method steps, by two injection-molding steps, for example, and thereafter to connect them to each other by a form fit or by adhesion.

EP 0 195 216 B1 discloses a data carrier in which there are punched clearances and a straight notch, with the minichip card being easy to remove from the carrier card by swinging it about a hinge-like notch.

SUMMARY OF THE INVENTION

An object of the present invention is to provide a low-cost method of producing data carriers which is quick and reliable and ensures that the minichip card can be held securely in the card carrier, but can be easily removed from or inserted into the carrier card.

The special advantage of the invention is, in particular, that a carrier card with a minichip card held in it with a form fit is produced in one mold. The data carrier thus formed does not need to be subsequently reworked in its form. One of the features for the invention is the production of the minichip card and the carrier card from different materials. The first component, for example but not by way of limitation the minichip card, is produced at a first, higher temperature and the second component, for example the carrier card, is produced subsequently, at a lower temperature, in one and the same mold. The fact that the first component is already in its final form when the second component is produced means that the second component can be produced in such a way that it is adapted to the form of the first component. As a result, the first component is advantageously used as a molding element in the mold, so that, for example, undercuts of the second component are made possible in a simple way.

According to a refinement of the invention, the minichip card and the carrier card are produced in one and the same injection mold from different polymer materials, each with a different softening temperature. In a first sub-step, the minichip card, for example, is formed as a first molded part from a first polymer material of a higher softening temperature. In a second sub-step, a second polymer material of a lower softening temperature is introduced into the mold, so that the carrier card is formed as a second molded part by "encapsulation" of the minichip card. Since the working temperature of the second molded part is lower than the softening temperature of the first molded part, the two molded parts lie one against the other with essentially no gaps, so that, if the mutually oriented contours of the molded parts are shaped appropriately, the minichip card embedded in the recess of the carrier card is held captive in the carrier card. The upper side and undersurface of the minichip card are flush with the corresponding upper side and undersurface of the carrier card, so that troublefree subsequent treatment of the surface of the data carrier is made possible.

Exemplary embodiments of the invention are explained in more detail below with reference to the drawings.

DETAILED DESCRIPTION OF THE PREFERRED EMBODIMENT

Figure 1:
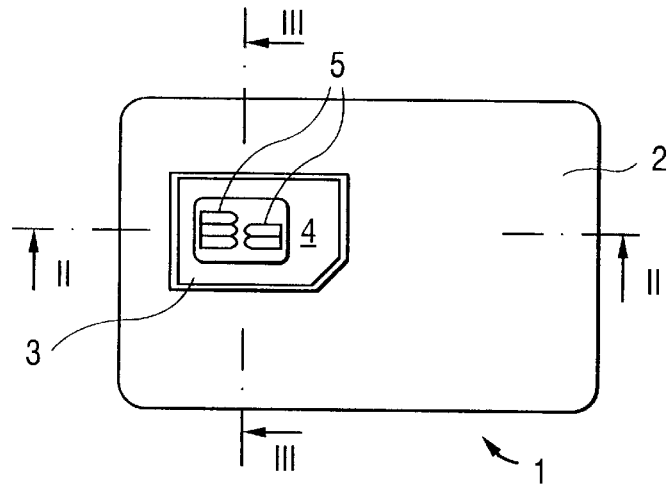
FIG. 1 is a plan view of a data carrier showing a carrier card with a minichip card embedded in the carrier card.

FIG. 1 shows a plan view of a data carrier 1, which in this example comprises a carrier card 2 the size of a credit card and a minichip card 3 embedded in the carrier card 2. The form and size of the carrier card 2 and of the minichip card 3 may be conveniently standardized.

The minichip card 3 has on its upper side 4 a plurality of contact areas 5, which are connected via electrical connecting lines (not shown) to an integrated circuit (chip) arranged inside the minichip card 3.

Figure 2:
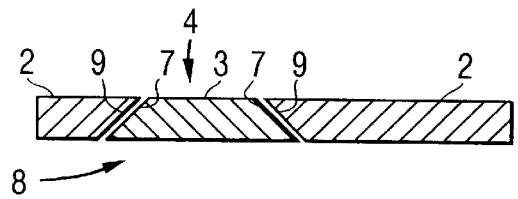
FIG. 2 is a longitudinal section view through the data carrier along the line II—II in FIG. 1.
Figure 3:
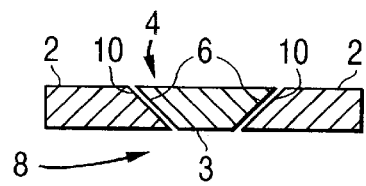
FIG. 3 is a cross section view through the data carrier along the line III—III in FIG. 1.

As can be seen from FIG. 2 and FIG. 3, the minichip card 3 is held by opposite, longitudinal sides 6 (shown in FIG. 3) and narrow sides 7 (shown in FIG. 2) with a form fit in a recess or in a receiving window of the carrier card 2. In this case, the narrow sides 7 are respectively formed such that they diverge from each other from the upper surface 4 to the undersurface 8, while the longitudinal sides 6 are formed such that they converge in the direction of the undersurface 8. The narrow sides 9 and longitudinal sides 10 of the carrier card 2, which surround the minichip card 3, are formed such that they correspond to the narrow sides 7 and the longitudinal sides 6 to provide a fit.

As FIG. 2 and FIG. 3 clearly show, these narrow and longitudinal sides 6, 7, 9, 10 yield in each case a trapezoidal design in cross section for the minicard, an inverse orientation existing between the narrow sides 7, 9 and the longitudinal sides 6, 10. This ensures reliable fixing of the minichip card 3 in the carrier card 2, but it being possible by bending or tilting the carrier card 2 with respect to the minichip card 3 for the latter to be pressed out from or re-inserted into the receiving window. Consequently, use of a first mobile phone system with the carrier card 2 and the embedded minichip card 3, on the one hand, and of a second mobile phone system just using the minichip card 3, on the other hand, in any desired sequence and independently of each other is ensured. Even when only using the mobile phone system which can be used just with the minichip card 3, after use of the mobile phone the minichip card 3 can be re-inserted into the receiving window of the carrier card 2 to store it.

The data carrier 1 described above is preferably produced by injection molding in a single injection-molding operation. In this example, the molded parts comprising the carrier card 2 and the minichip card 3 are produced one immediately after the other within one injection molding operation of a two-component injection-molding machine. Optionally, the carrier card 2 or the minichip card 3 may be produced first.

If, for example, the minichip card 3 is to be molded in a first sub-step, desired electronic components are placed into an injection mold and are encapsulated in a first polymer compound. After curing of the first polymer compound, the elements of the mold forming the longitudinal sides 6 and the narrow sides 7 are moved out in the transverse direction to the extent that their arrangement then establishes the outer peripheral dimensions of the carrier card 2.

In a second sub-step, a second polymer compound is then injected into the then-enlarged mold, this second polymer compound having a lower softening temperature than the first polymer compound. The molding of the carrier card 2 takes place at a lower temperature than the softening temperature of the first polymer compound of the minichip card 3, so that the carrier card 2 is molded without an intimate bond occurring between the carrier card 2 and the minichip card 3. The narrow sides 9 and the longitudinal sides 10 form, these sides bearing substantially with their full surface area against the narrow sides 7 and the longitudinal sides 6, respectively, of the minichip card 3. After curing of the second polymer compound, the mold may be opened, and the clamped together molded parts, namely the carrier card 2 and the minichip card 3, can then be removed. They can then together undergo further treatments, in particular a surface treatment.

The carrier card 2 and the minichip card 3 are formed from different polymer materials, in particular of a thermoplastic polymer, which differ in that they have different softening temperatures. The minichip card 3 is preferably produced from polypropylene and the carrier card 2 is preferably produced from ABS (acryl-butadiene styrene). For a polypropylene molding compound, the processing temperatures for injection molding lie in the range from 250° to 270°. The processing temperatures of ABS lie in the range from 180° to 280°. By suitable choice of the polypropylene and the ABS material, it is consequently possible to find two polymer compounds of which the processing and softening temperatures are sufficiently far apart from each other for them to be processed according to the invention.

By way of example, the minichip card could be formed from a polymer compound such as PBT (polybutylentherephthalat) with the carrier card made from POM (polyoxymethylen). The injection temperature of PBT may be in the range of 240° C. to 270° C., while the injection temperature for POM may be in the range of 180° C. to 220° C.

As a second example, the minichip card could be formed from a polymer compound such as PA (polyamid), with the carrier card made from POM (polyoxymethylen). The injection temperature of PA may be in the range of 230° C. to 320° C. and the injection temperature of the POM may be in the range of 180° C. to 220° C.

Note that the pressure value used during the injection molding process depends on the configuration of the molding machine and the mold itself, as is well known in the art.

Typical curing times between steps are on the order of 1 to 3 seconds.

Figure 4:
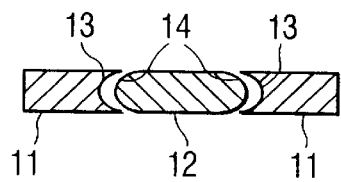
FIG. 4 is a cross section view through a data carrier according to a second exemplary embodiment.

Alternatively, the mold may be designed such that the longitudinal and narrow sides of the carrier card 2 and minichip card 3 have different contours. For example, a carrier card 11 and a minichip card 12 may respectively have cross-sectionally arcuate longitudinal sides 13 and 14 and narrow sides. As FIG. 4 shows, the longitudinal sides 14 of the minichip card 12 are curved outward, bearing with a form fit against the inwardly curved longitudinal sides 13 of the carrier card 11. The degree of curvature establishes the flexural loading when the minichip card 12 is pressed out from or inserted into the carrier card 11.

Figure 5:
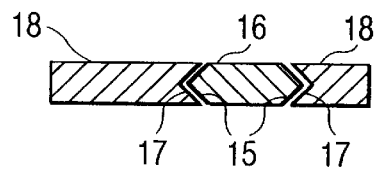
FIG. 5 is a cross section through a data carrier according to a third exemplary embodiment.

According to a further exemplary embodiment as shown in FIG. 5, at least two sides, in particular longitudinal sides 15, of a minichip card 16 may be of a wedge-shaped design. These bear with their full surface area against corresponding longitudinal sides 17 of a carrier card 18, which are respectively designed as tapering grooves. The angle of the wedge or the groove establishes the flexural forces required for pressing out or inserting the minichip card 16. Alternatively, any other contours of the receiving window or the minichip card, which may depend on the respective application, can be produced.

From the above it can be seen that a simplified and speeded-up method of production for data carriers that comprise a carrier card and an embedded minichip card has been disclosed. The method is quick, reliable and ensures a carrier card-minichip card fit that facilitates removal and reinsertion.

It should be noted that although the present example showed the minichip card being formed with the higher softening temperature material in the first step, the invention is not limited to this sequence. The carrier card could be molded first with the higher softening temperature material having a molded recess, and then the minichip card could be molded in the recess with the second material having the lower softening temperature.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method of producing a data carrier having a carrier card, and a minichip card which can be removed from the carrier card and has an integrated circuit therein, comprising the steps of:

a first step of forming one of the minichip card around a separate chip module and the carrier card with a first material having a first softening temperature; and a second step of forming the other of the minichip card and the carrier card, with a second material having a second softening temperature different from said first softening temperature, in the presence of the card formed in the first step in such a way that the minichip card is held in a receiving window of the carrier card by the latter with a form fit, while avoiding material bonding with the carrier card.

2. The method as claimed in claim 1, wherein the card with the material having a higher softening temperature is made in said first forming step.

3. The method as claimed in claim 2, wherein the first and second materials are different polymer compounds.

4. The method as claimed in claim 3, wherein said second forming step comprises the step of forming the card with a lower softening temperature at a temperature below the softening temperature of said first formed card.

5. The method as claimed in claim 4, wherein, in said first forming step, the minichip card is formed from a first polymer compound with a first softening temperature and, in said second forming step, the carrier card is produced from a second polymer compound, having a second softening temperature which is lower than the first softening temperature, in one and the same mold.

6. The method as claimed in claim 5, characterized in that the minichip card and the carrier card are in each case produced in one and the same injection mold, so that mutually oriented contours of the minichip card and the carrier card bear directly against one another.

7. The method as claimed in claim 6, wherein the carrier card and the minichip card are produced from a thermoplastic material.

8. The method as claimed in claim 6, wherein the minichip card is produced from a polypropylene material and the carrier card is produced from an ABS polymer material.

9. The data carrier resulting from the method as claimed in claim 6.

10. The method as claimed in claim 5, wherein the outer contours of the minichip card are formed such that they complement the inner contours of the carrier card.

11. The method as claimed in claim 2, characterized in that the minichip card and the carrier card are in each case produced as a one-piece molded part in one and the same injection mold, a first molded part being produced in said first forming step and a second molded part being produced in said second forming step at a temperature below the softening temperature of the first molded part, so that the mutually oriented contours of the molded parts bear directly against one another.

12. The method as claimed in claim 2, wherein the outer contours of the minichip card are formed such that they complement the inner contours of the carrier card.

13. The method as claimed in claim 2, wherein the carrier card and the minichip card are produced from a thermoplastic material.

14. The method as claimed in claim 2, wherein the minichip card is produced from a polypropylene material and the carrier card is produced from an ABS polymer material.

15. The data carrier resulting from the method as claimed in claim 2.

16. The method as claimed in claim 1, characterized in that the minichip card and the carrier card are in each case produced as a one-piece molded part in one and the same injection mold, with a first molded part being produced in said first forming step and a second molded part being produced in said second forming step at a temperature below the softening temperature of the first molded part, so that the mutually oriented contours of the molded parts bear directly against one another.

17. The method as claimed in claim 1, wherein the outer contours of the minichip card are formed such that they complement the inner contours of the carrier card.

18. The method as claimed in claim 1, wherein the carrier card and the minichip card are produced from a thermoplastic material.

19. The method as claimed in claim 1, wherein the minichip card is produced from a polypropylene material and the carrier card is produced from an ABS polymer material.

20. The data carrier resulting from the method as claimed in claim 19.

21. The data carrier resulting from the method as claimed in claim 1.

22. A method of producing a data carrier having a carrier card, and a minichip card which can be removed from the carrier card and has an integrated circuit therein, comprising the steps of:
   a first step of forming one of the minichip card and the carrier card with a first material having a first softening temperature;
   a second step of forming the other of the minichip card and the carrier card, with a second material having a second softening temperature different from said first softening temperature, in the presence of the card formed in the first step in such a way that the minichip card is held in a receiving window of the carrier card by the latter with a form fit, while avoiding material bonding with the carrier card;
   wherein, in said first forming step, the minichip card is formed from a first polymer compound with a first softening temperature and, in said second forming step, the carrier card is produced from a second polymer compound, having a second softening temperature which is lower than the first softening temperature, in one and the same mold; and
   wherein the minichip card and the carrier card are in each case produced in one and the same injection mold, so that mutually oriented contours of the minichip card and the carrier card bear directly against one another.

23. A method of producing a data carrier having a carrier card, and a minichip card which can be removed from the carrier card and has an integrated circuit therein, comprising the steps of:
   a first step of forming one of the minichip card and the carrier card with a first material having a first softening temperature; and
   a second step of forming the other of the minichip card and the carrier card, with a second material having a second softening temperature different from said first softening temperature, in the presence of the card formed in the first step in such a way that the minichip card is held in a receiving window of the carrier card by the latter with a form fit, while avoiding material bonding with the carrier card;
   wherein the minichip card and the carrier card are in each case produced as a one-piece molded part in one and the same injection mold, with a first molded part being produced in said first forming step and a second molded part being produced in said second forming step at a temperature below the softening temperature of the first molded part, so that the mutually oriented contours of the molded parts bear directly against one another.

24. A method of producing a data carrier having a carrier card, and a minichip card which can be removed from the carrier card and has an integrated circuit therein, comprising the steps of:

a first step of forming one of the minichip card and the carrier card with a first material having a first softening temperature;

a second step of forming the other of the minichip card and the carrier card, with a second material having a second softening temperature different from said first softening temperature, in the presence of the card formed in the first step in such a way that the minichip card is held in a receiving window of the carrier card by the latter with a form fit, while avoiding material bonding with the carrier card;

wherein the card with the material having a higher softening temperature is made in said first forming step; and wherein the minichip card and the carrier card are in each case produced as a one-piece molded part in one and the same injection mold, a first molded part being produced in said first forming step and a second molded part being produced in said second forming step at a temperature below the softening temperature of the first molded part, so that the mutually oriented contours of the molded parts bear directly against one another.

25. A method of producing a data carrier having a carrier card, and a minichip card which can be removed from the carrier card and has an integrated circuit therein, comprising the steps of:

a first step of forming one of the minichip card around a separate chip module and the carrier card with a first material having a first softening temperature; and a second step of forming the other of the minichip card and the carrier card, with a second material having a second softening temperature different from said first softening temperature, in the presence of the card formed in the first step in such a way that the minichip card is held in a receiving window of the carrier card by the latter with a form fit, while avoiding material bonding with the carrier card;

wherein the card with the material having a higher softening temperature is made in said first forming step; and wherein the first and second materials are different polymer compounds.

* * * * *